(12) United States Patent
Albert et al.

(10) Patent No.: US 9,274,571 B2
(45) Date of Patent: Mar. 1, 2016

(54) SEGMENTED FRAME FOR A STORAGE DRIVE

(71) Applicant: HGST NETHERLANDS B.V., Amsterdam (NL)

(72) Inventors: Glenn Douglas Albert, Longmont, CO (US); Michael Stephen Bell, Colorado Springs, CO (US); David William Niss, Boulder, CO (US); Jeffrey David Wilke, Palmer Lake, CO (US)

(73) Assignee: HGST Netherlands B.V., Amsterdam (NL)

( * ) Notice: Subject to any disclaimer, the term of this patent is extended or adjusted under 35 U.S.C. 154(b) by 119 days.

(21) Appl. No.: 14/265,567

(22) Filed: Apr. 30, 2014

(65) Prior Publication Data

US 2015/0316964 A1 Nov. 5, 2015

(51) Int. Cl.
*G06F 1/16* (2006.01)
*G06F 1/18* (2006.01)
*H05K 5/00* (2006.01)
*H05K 7/18* (2006.01)

(52) U.S. Cl.
CPC .............. *G06F 1/187* (2013.01); *H05K 5/0021* (2013.01); *H05K 7/18* (2013.01)

(58) Field of Classification Search
USPC ..................... 349/58, 158, 62, 150, 139, 149;
361/679.22, 679.01, 679.08, 679.09,
361/679.27, 679.23, 679.07, 679.06,
361/679.26, 679.05, 679.59; 345/212, 80,
345/2.2, 650, 211, 419, 660, 207, 168, 697,
345/156, 204; 455/575.8, 557, 462.1,
455/556.1; 206/45.25, 45.24, 305, 459.5;
248/176.3, 231.51, 226.11, 158, 125.9,
248/166, 131, 127, 129, 921, 922;
312/223.1, 223.2
See application file for complete search history.

(56) References Cited

U.S. PATENT DOCUMENTS

| 6,339,532 B1 | 1/2002 | Boulay et al. |
| 6,487,071 B1 | 11/2002 | Tata et al. |
| 6,693,796 B2 | 2/2004 | Ives et al. |
| 7,187,543 B2 | 3/2007 | Zimlin |
| 7,719,828 B2 | 5/2010 | Brown et al. |
| 8,508,928 B2 * | 8/2013 | Killen .................. G11B 33/124 361/679.33 |
| 2003/0048607 A1 * | 3/2003 | Ives ....................... G11B 33/08 361/695 |
| 2009/0091884 A1 * | 4/2009 | Walker .................... G06F 1/187 361/679.37 |
| 2009/0097195 A1 | 4/2009 | Colligan |
| 2011/0096494 A1 | 4/2011 | Cochrane |

OTHER PUBLICATIONS

"Data Storage Rotational Vibration Solution", E-A-R's ISOLOSS & ISODAMP.

* cited by examiner

*Primary Examiner* — Hung Duong

(57) ABSTRACT

A segmented frame adapted to receive a storage drive is provided. The segmented frame in one example includes a plurality of linked frame segments configured to pivot with respect to each other and wrap around the storage drive, with a first frame segment and a last frame segment of the plurality of linked frame segments latching together to form a joined segmented frame and hold the storage drive, and a plurality of isolator cups trapped within the joined segmented frame and fitting over a corresponding plurality of mounting wings extending from the storage drive, wherein the plurality of isolator cups suspend the storage drive within the joined frame.

20 Claims, 12 Drawing Sheets

SEGMENTED FRAME FOR A STORAGE DRIVE

BACKGROUND OF THE INVENTION

1. Field of the Invention

Aspects of the disclosure are related to the field of data storage systems, and in particular, to a frame for receiving a storage drive.

2. Description of the Related Art

As computer systems and networks grow in numbers and capability, there is a need for more and more storage system capacity. Cloud computing and large-scale data processing have further increased the need for digital data storage systems that are capable of transferring and holding immense amounts of data.

One approach to providing sufficient data storage is the use of arrays of Hard Disk Drives (HDDs). A number of HDDs can be held in a container, sometimes referred to as a sled. A sled is a modular unit that can hold and operate a number of HDDs. The HDDs are held and operated in close proximity within the sled, so that many HDDs can be fit into a defined volume. Multiple sleds can be installed in a chassis assembly, with a chassis assembly being installed in racks or other support structures. Consequently, storage capacity can be increased in large increments by the installation of an additional chassis assembly or chassis assemblies.

HDDs include a spinning disk. A read head is moved inward or outward with respect to the spinning disk in order to read and write data. These moving components generate vibrations in the HDD.

Each HDD to be included in a sled can include a frame, wherein the frame and HDD are designed to fit into the sled. Consequently, the frame can transmit shocks and vibrations to the sled and to other frames and HDDs within the sled. The transferred vibrations can interfere with operations of the affected HDD or HDDs. The transferred vibrations can disrupt or block the read and write operations in an affected HDD. The transferred vibrations can combine with local vibrations already produced by the affected HDD to produce stronger and more disruptive vibrations than where the affected HDD is operating in isolation. The transferred vibrations can cause increase wear and breakage in components of the affected HDD.

SUMMARY OF THE INVENTION

A segmented frame adapted to receive a storage drive is provided. The segmented frame in one example includes a plurality of linked frame segments configured to pivot with respect to each other and wrap around the storage drive, with a first frame segment and a last frame segment of the plurality of linked frame segments latching together to form a joined segmented frame and hold the storage drive, and a plurality of isolator cups trapped within the joined segmented frame and fitting over a corresponding plurality of mounting wings extending from the storage drive, wherein the plurality of isolator cups suspend the storage drive within the joined frame.

DETAILED DESCRIPTION OF THE INVENTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Figure 1:
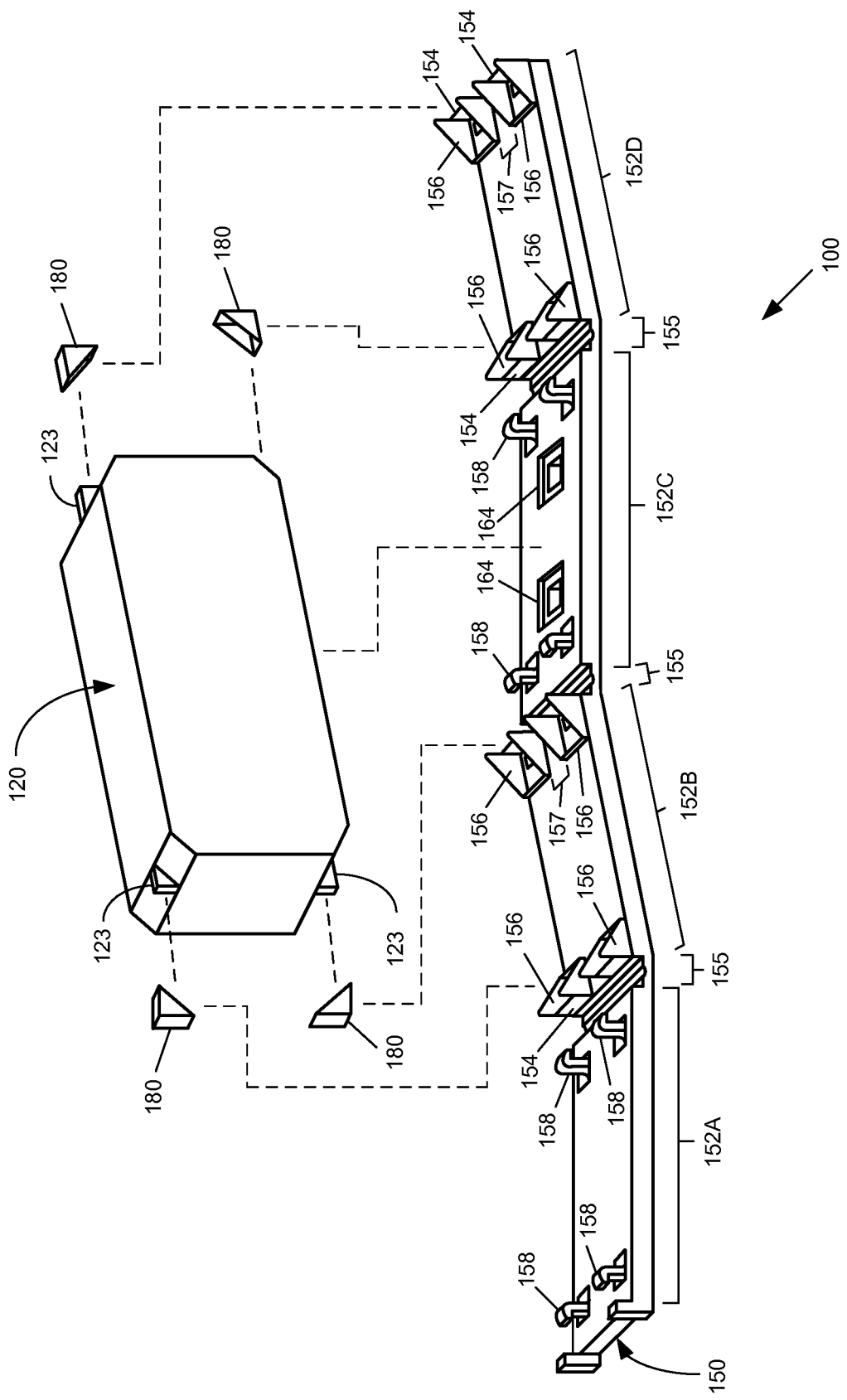
FIG. 1 shows a storage drive system comprising a storage drive and a segmented frame configured to hold the storage drive.

FIG. 1 shows a storage drive system 100 comprising a storage drive 120 and a segmented frame 150 configured to hold the storage drive 120. The segmented frame 150 comprises a plurality of linked frame segments 152 capable of pivoting with respect to each other. The plurality of linked frame segments 152 are configured to wrap around the storage drive 120, with a first frame segment 152A and a last frame segment 152D latching together to form a joined segmented frame 150 and hold the storage drive 120.

The storage drive 120 comprises a storage device for storing digital data. The storage drive 120 includes one or more disk storage medium for storing digital data. The storage drive 120 comprises non-volatile storage in some examples. The storage drive 120 includes magnetic or optical storage medium in some examples. In addition, the storage drive 120 can include other storage types, including solid-state storage devices in some examples.

The storage drive 120 includes a plurality of mounting wings 123. The plurality of mounting wings 123 extend from corner regions of the storage drive 120 in the example shown. The plurality of mounting wings 123 comprise lugs extending from the exterior or case of the storage drive 120. The plurality of mounting wings 123 therefore provide mounting or suspension features by which the storage drive 120 can be held in position in the segmented frame 150.

The segmented frame 150 in some examples includes four frame segments 152A-152D. However, the number of frame segments 152 can vary, such as to match the shape and configuration of the storage drive 120. The frame segments 152A-152D are substantially planar and are formed of a substantially rigid material. The frame segments 152 can include ribs or other structures formed into the frame segments 152 to provide structural rigidity. The frame segments 152A-152D are pivotally joined, such as by webs 155. The webs 155 comprise thinner portions of the frame segments 152 that allow the frame segments 152A-152D to pivot. Alternatively, the webs 155 can comprise hinges or other pivot mechanisms or pivot structures. Each frame segment 152 can be pivoted to an angle of about ninety degrees with respect to adjacent frames. As a result, the segmented frame 150 can be formed into a joined frame structure, where the joined segmented frame 150 comprises a substantially rectangular or substantially square shape in some embodiments.

The segmented frame 150 in some examples includes pairs of spaced-apart bulwarks 156 formed on a frame segment 152. The bulwarks 156 are formed on an end or ends of the frame segment 152, wherein the bulwarks 156 are located in the corners of the joined segmented frame 150 (see FIG. 2). The spaced-apart pairs of bulwarks 156 trap a corresponding isolator cup 180 within the joined segmented frame 150. The spaced-apart pairs of bulwarks 156 may be configured to provide a predetermined friction or predetermined compression to the corresponding isolator cup 180 when the isolator cup 180 is positioned between a pair of spaced-apart bulwarks 156.

The segmented frame 150 includes a plurality of latching devices 158 on a first frame segment 152A and on a third frame segment 152C in the example shown. In addition, each bulwark 156 includes a latch web 154 and a latch release aperture 159. A latching device 158 will resiliently pass over and then spring back to engage a latch web 154 of a bulwark 156 on an adjacent frame segment when the plurality of linked frame segments 152 are moved to the joined segmented frame configuration (see FIG. 4). The plurality of latching devices 158 are configured to latch to the latch webs 154 of bulwarks 156 when the segmented frame 150 is moved to the joined segmented frame configuration. The plurality of latching devices 158 comprise at least partially resilient members in some examples that must be deformed before latching to an adjacent frame segment.

The latching device 158 will be adjacent to a corresponding latch release aperture 159. The latching device 158 can be disengaged from the latch web 154 by insertion of a suitable tool into the latch release aperture 159, wherein the tool deflects the latching device 158 away from the latch web 154.

The bottom frame segment 152C further includes two riser apertures 164. The two riser apertures 164 receive and retain riser blocks 808 of isolator systems 800 (see FIG. 10).

Figure 2:
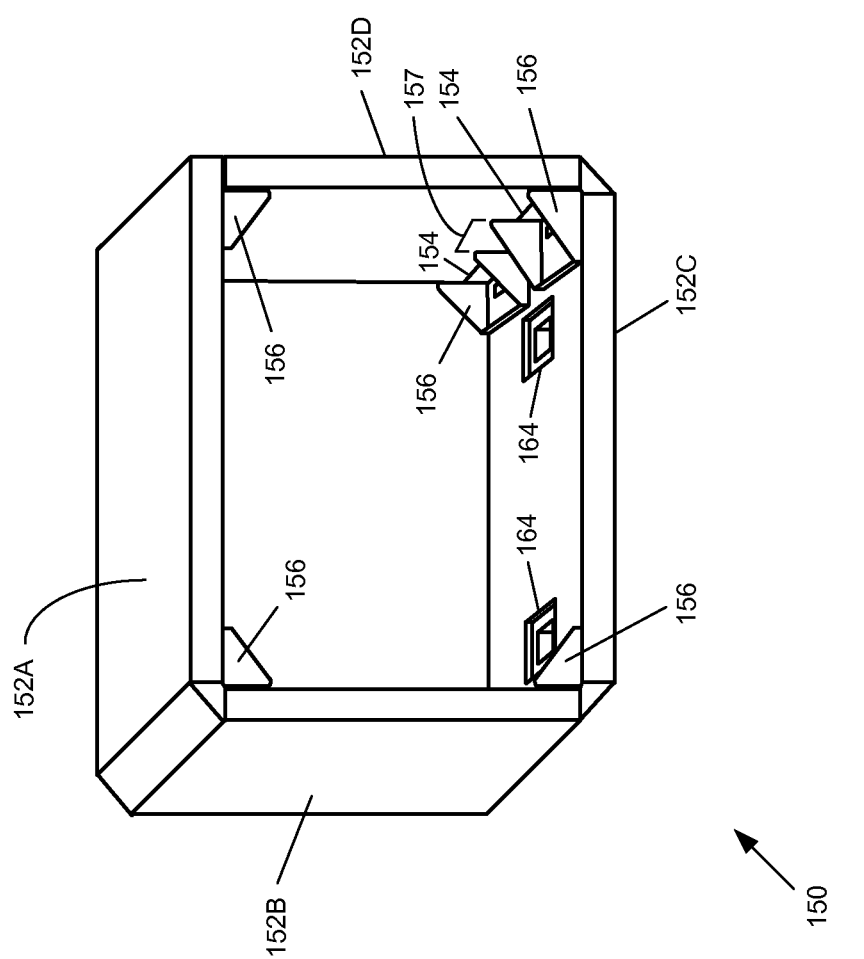
FIG. 2 shows a plurality of linked frame segments formed into the joined segmented frame.

FIG. 2 shows the plurality of linked frame segments 152A-152D formed into the joined segmented frame 150. In this example, it can be seen that the first frame segment 152A is latched to the last (or fourth) frame segment 152D. The bulwarks 156 stop a pivoting motion between adjacent frames at about ninety degrees of angle. The bulwarks 156 therefore act as pivot stops and give the joined segmented frame 150 additional rigidity. Consequently, the joined segmented frame 150 in the example shown has a substantially rectangular or substantially square shape.

In addition, the pairs of bulwarks 156 form the cup receptacles 157 for receiving the isolator cups 180. The isolator cups 180 are formed to have a predetermined clearance with the cup receptacles 157, wherein an isolator cup 180 is at least partially compressed within the space between pairs of bulwarks 156.

Figure 3:
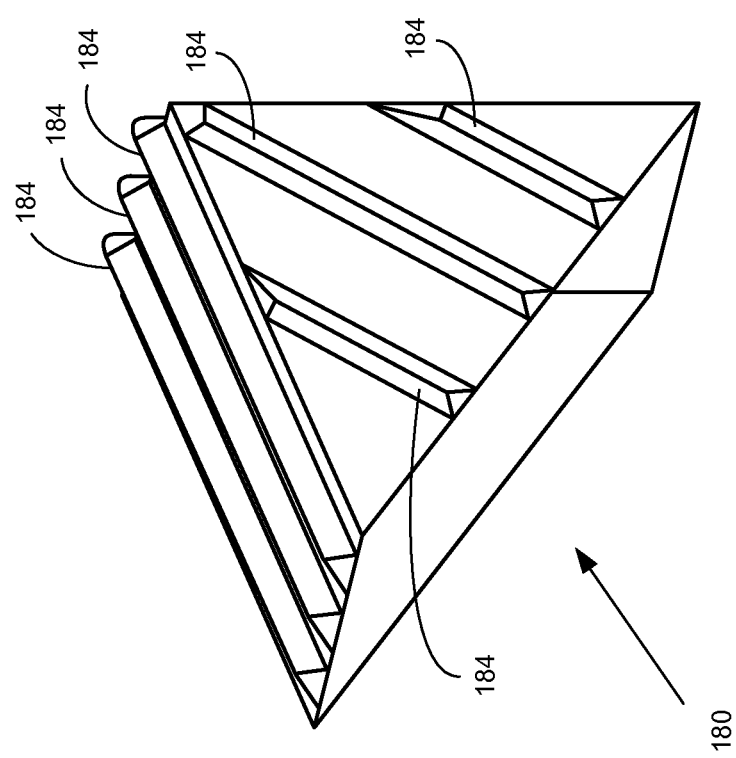
FIG. 3 shows an exemplary isolator cup.

FIG. 3 shows an exemplary isolator cup 180. The isolator cup 180 comprises a substantially triangular shape that is substantially hollow. The isolator cup 180 is configured to fit over a mounting wing 123 of the storage drive 120.

The isolator cup 180 is formed of an elastomeric material that can be at least partially compressed. The isolator cup 180 is formed of an elastomeric material that dampens shocks and vibrations. The isolator cup 180 in some examples is formed of an elastomeric material or viscoelastomeric material that absorbs a relatively high amount of compression energy when being deformed and therefore highly dampens shocks and vibrations.

The isolator cup 180 is designed to fit over a corresponding mounting wing 123 of the storage drive 120. The isolator cup 180 is formed to fit snugly over the mounting wing 123 in some examples, and may even require a slight deformation to fit over the mounting wing 123. Alternatively, the isolator cup 180 is formed to fit over the mounting wing 123 without deforming in other examples.

The isolator cup 180 in some examples includes ribs 184 formed on exterior surfaces. The ribs 184 can comprise triangular cross-section shapes, as shown, or can comprise other cross-sectional shapes. The ribs 184 are configured to be at least somewhat compressed when the isolator cup 180 is in place in a cup receptacle 157 in the joined segmented frame 150. Alternatively, or in addition, the isolator cup 180 can include ribs 184 formed on interior surfaces.

Figure 4:
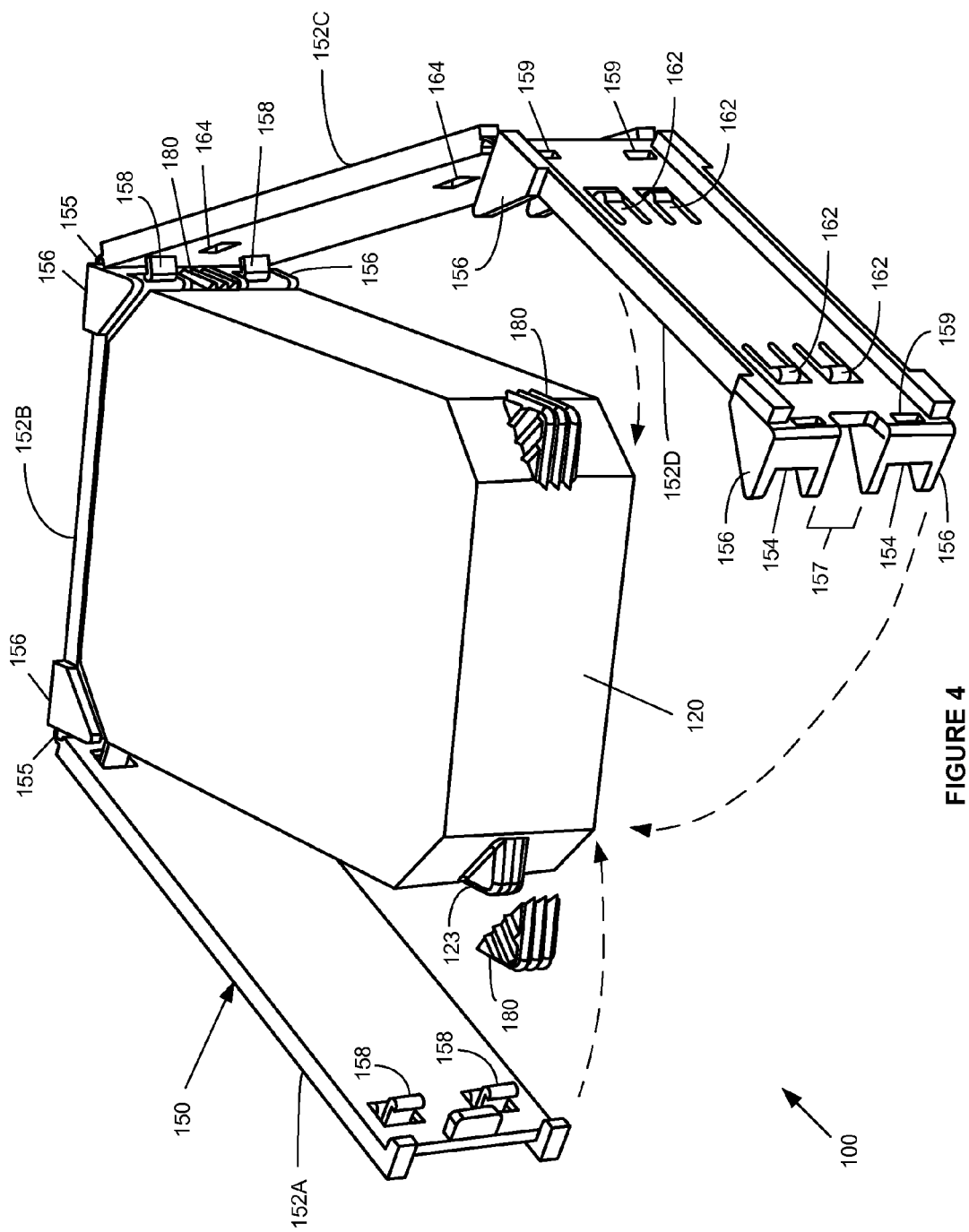
FIG. 4 shows the joined segmented frame holding the storage drive.

FIG. 4 shows the joined segmented frame 150 holding the storage drive 120. The frame segments 152 are shown wrapping around the substantially rectangular perimeter of the storage drive 120 in this example. Isolator cups 180 are positioned on the mounting wings 123 extending from corners of the storage drive 120. As the frame segments 152 wrap around the storage drive 120, the isolator cups 180 fit into the cup receptacles 157 formed in the corners of the joined segmented frame 150, between the pairs of spaced-apart bulwarks 156.

As the frame segments 152 approach the joined position, the latching devices 158 resiliently pass over and latch to the latch webs 154 on adjacent frame segments. In the example shown, the latching devices 158 on the frame segments 152A and 152C latch to the bulwarks 156 on the frame segments 152B and 152D. Consequently, the joined segmented frame 150 forms a substantially rigid structure that surrounds and holds the storage drive 120. The joined segmented frame 150 (and the storage drive 120) can now be installed into other systems or devices, such as in a sled frame 205, for example (see FIG. 6).

Figure 5:
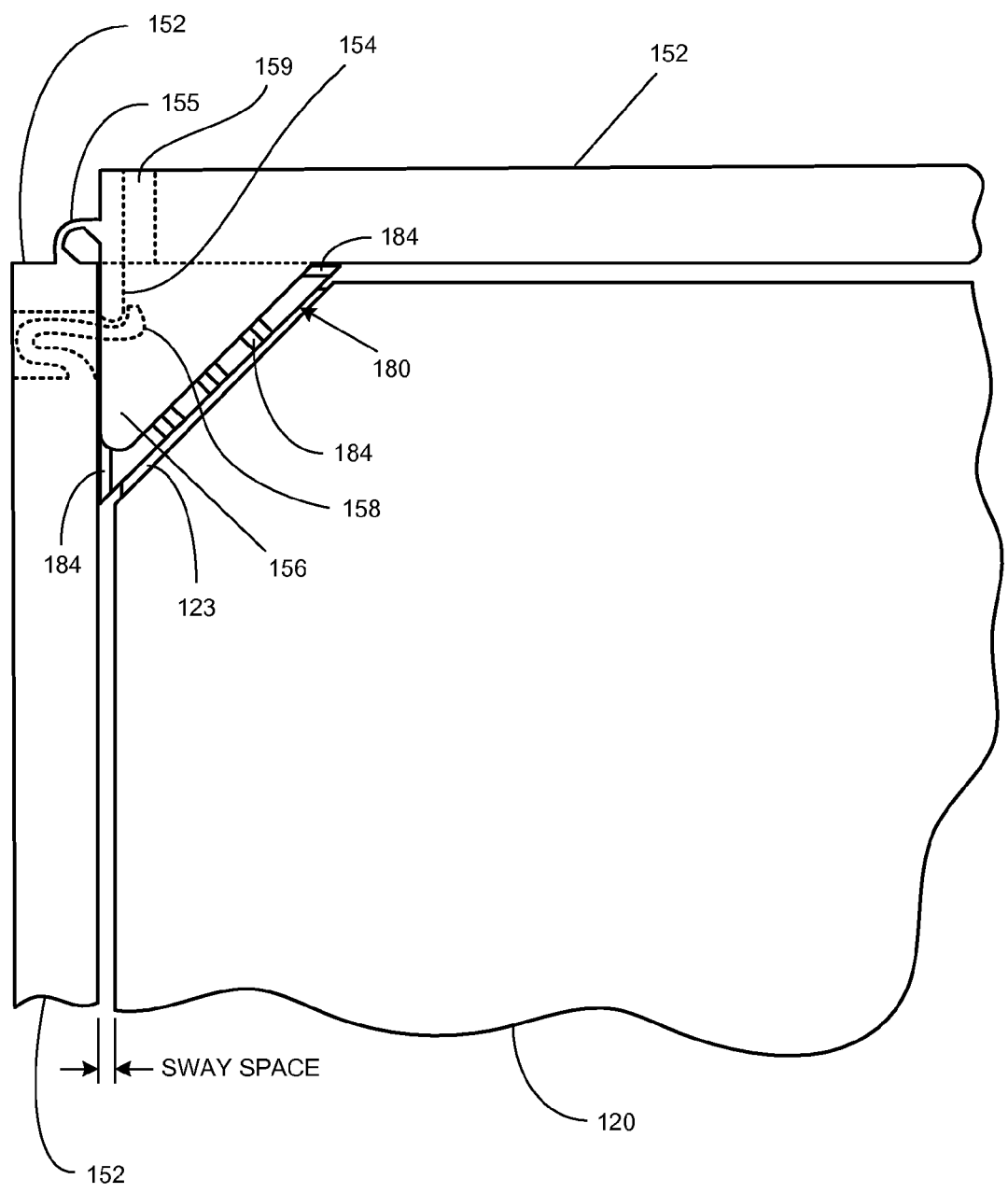
FIG. 5 shows detail of a corner of the joined segmented frame.

FIG. 5 shows detail of a corner of the joined segmented frame 150. It can be seen from the figure that the joined segmented frame 150 holds the storage drive 120 only at the corners, via the isolator cups 180. In an embodiment of the storage drive 120 having four corners and four mounting wings 123, the storage drive 120 is suspended at these four locations. The joined segmented frame 150 does not otherwise contact of support the storage drive 120. This minimizes the transmission of shocks or vibration between the storage drive 120 and the joined segmented frame 150.

It can be seen that the frame segments 152A-152D do not contact the sides of the storage drive 120. Instead, a sway space is maintained between the joined segmented frame 150 and the storage drive 120. The sway space comprises a predetermined clearance, wherein the joined segmented frame 150 does not contact the sides of the storage drive 120.

This figure further shows the deformation of a web 155, allowing the frame segments 152 to pivot with respect to each other. Moreover, this figure shows a latching device 158 of the left frame segment 152 in the figure latching to a latch web 154 of the upper frame segment 152.

Figure 6:
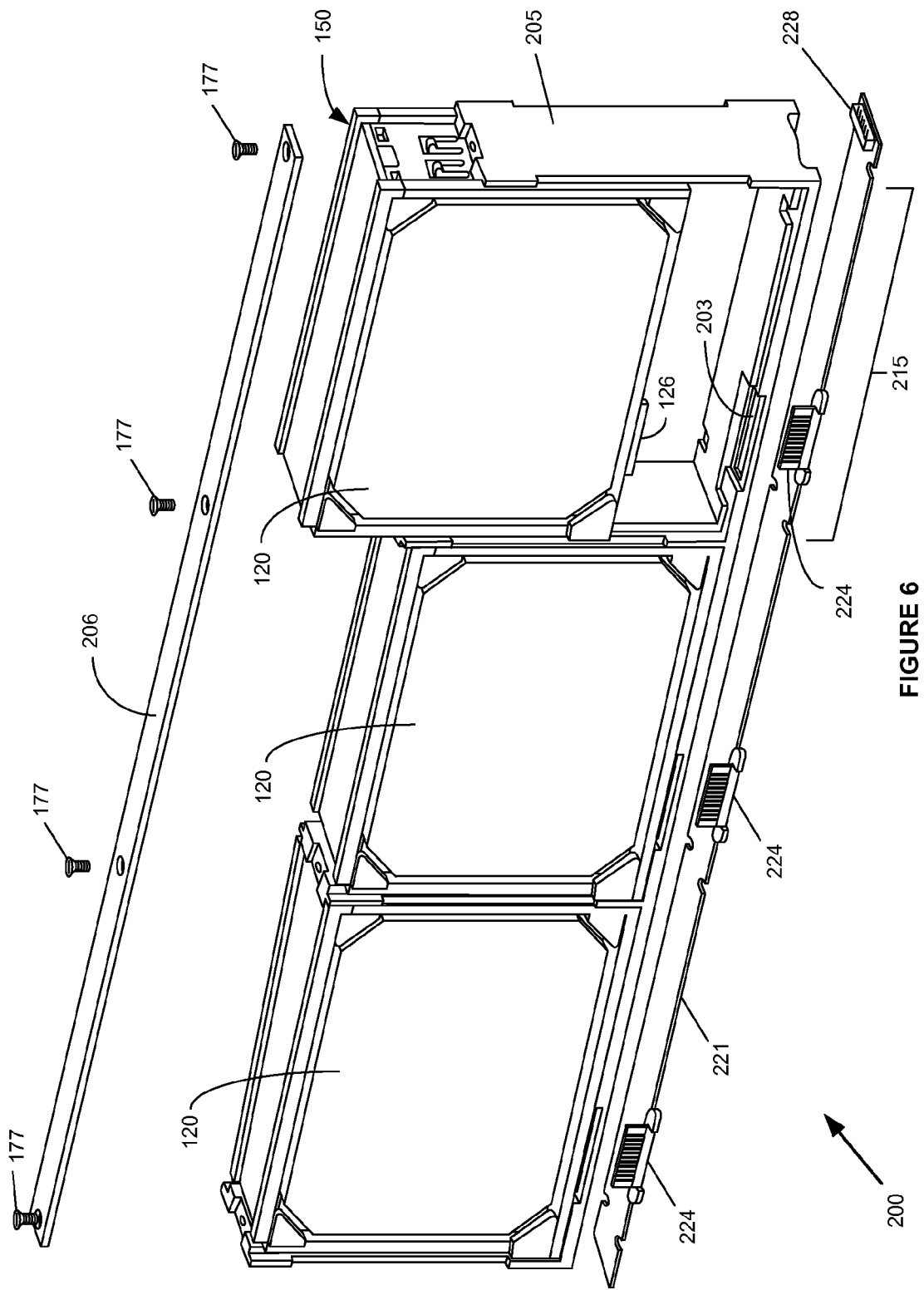
FIG. 6 shows three storage drive systems being assembled into a storage drive sled.

FIG. 6 shows three storage drive systems 100 being assembled into a storage drive sled 200. The three storage drive systems 100 comprise three joined segmented frames 150 holding three corresponding storage drives 120. The storage drive sled 200 includes a sled frame 205, a frame cap 206 and one or more fasteners 207 that assemble to fastener bores 204 in the top portions of the sled frame 205, and a backplane 221 that assembles to the bottom of the sled frame 205. Each storage drive system 100 slides down into a storage drive bay 215 of the sled frame 205. Each storage drive bay includes a connector aperture 203, wherein a connector 224 of the backplane 221 and a connector component 126 of the storage drive 120 can interconnect. The frame cap 206 is affixed to the sled frame 205 when the three storage drive systems 100 are in place, wherein the frame cap 206 holds the storage drive systems 100 in the storage drive bays 215. The assembled storage drive sled 200 comprises a multi-storage device assembly that can be added to a chassis assembly 900 (see FIG. 12).

The backplane 221 includes three corresponding drive connectors 224 that extend up into the storage drive bays 215 when the backplane 221 is in position against the underside of the sled frame 205. The backplane 221 further includes traces or other conductors that electrically couple the three drive connectors 224 to a backplane connector 228. The backplane connector 228 is externally available for the storage drive sled 200. Suitable fastener devices affix the backplane 221 to the bottom of the sled frame 205. In addition, suitable shock/vibration damping devices (not shown) are included between the backplane 221 and the sled frame 205, wherein shocks and vibrations are not transferred between the backplane 221 and the sled frame 205.

Figure 7:
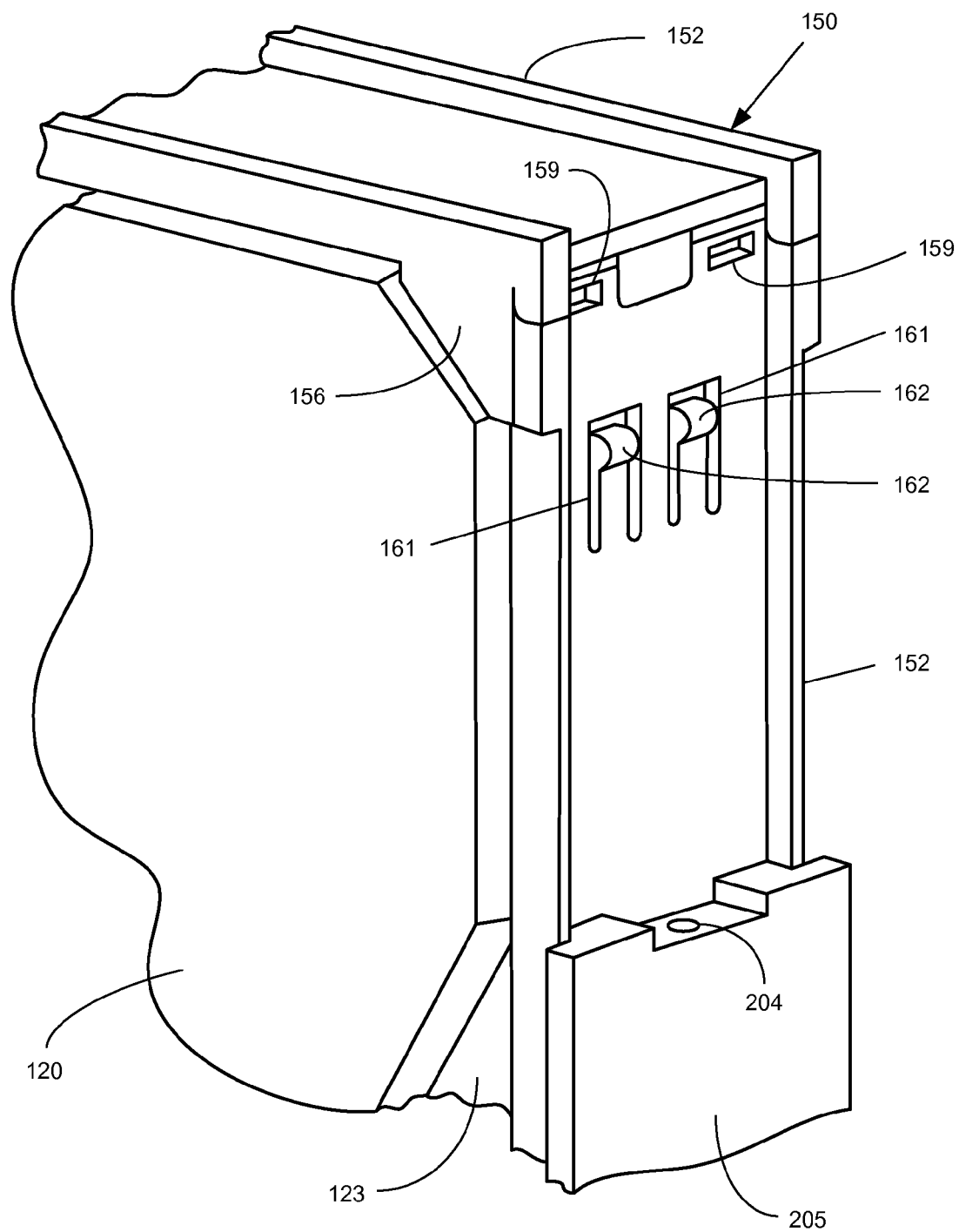
FIG. 7 shows detail of a side of the joined segmented frame.

FIG. 7 shows detail of a side of the joined segmented frame 150. The frame segments on the side of the joined segmented frame 150 include one or more resistance elements 162. In the example shown, a resistance element 162 comprises a resilient member including a projection, with the resilient member being located in a cut-out 162 in the frame segment 152. The resistance element 162 can be deformed inward when the storage drive system 100 is inserted into the sled frame 205. The resistance element 162 can require a predetermined deformation force to be deformed inward during insertion of the storage drive system 100. The resistance element 162 therefore resists the insertion of the storage drive system 100 into the sled frame 205. The resistance element 162 at least somewhat counteracts the weight of the storage drive system 100. Alternatively, the one or more resistance elements 162 can comprise frictional elements or compressible elements that resist insertion of the storage drive system 100 for controlled insertion into the sled frame 205.

Figure 8:
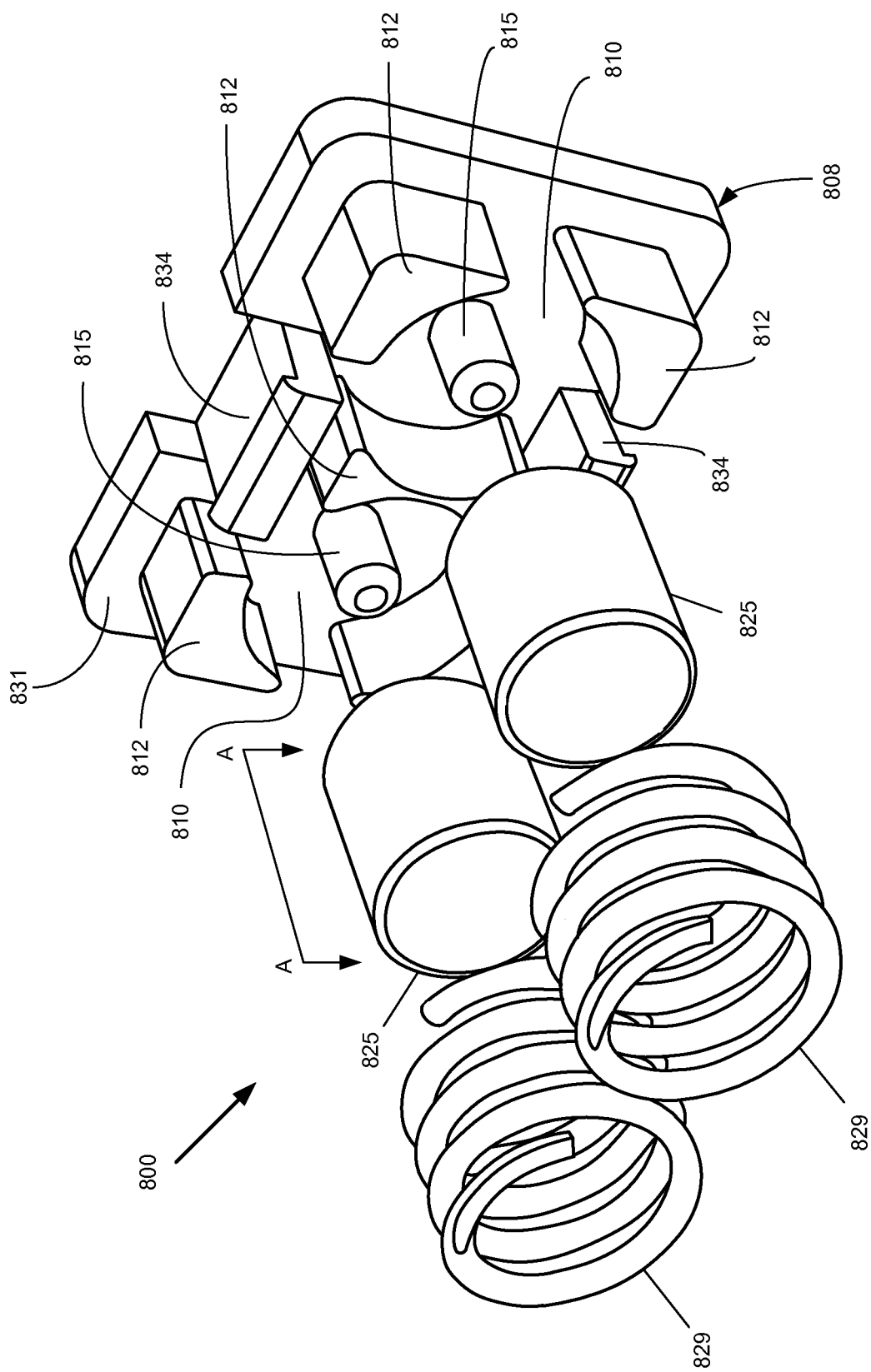
FIG. 8 shows an isolator system for use in the joined segmented frame.

FIG. 8 shows an isolator system 800 for use in the joined segmented frame 150. The isolator system 800 comprises a riser block 808, one or more elastomeric dampers 825, and one or more corresponding coil springs 829. The one or more elastomeric dampers 825 fit to the riser block 808. The one or more coil springs 829 fit to the one or more corresponding elastomeric dampers 825.

Figure 10:
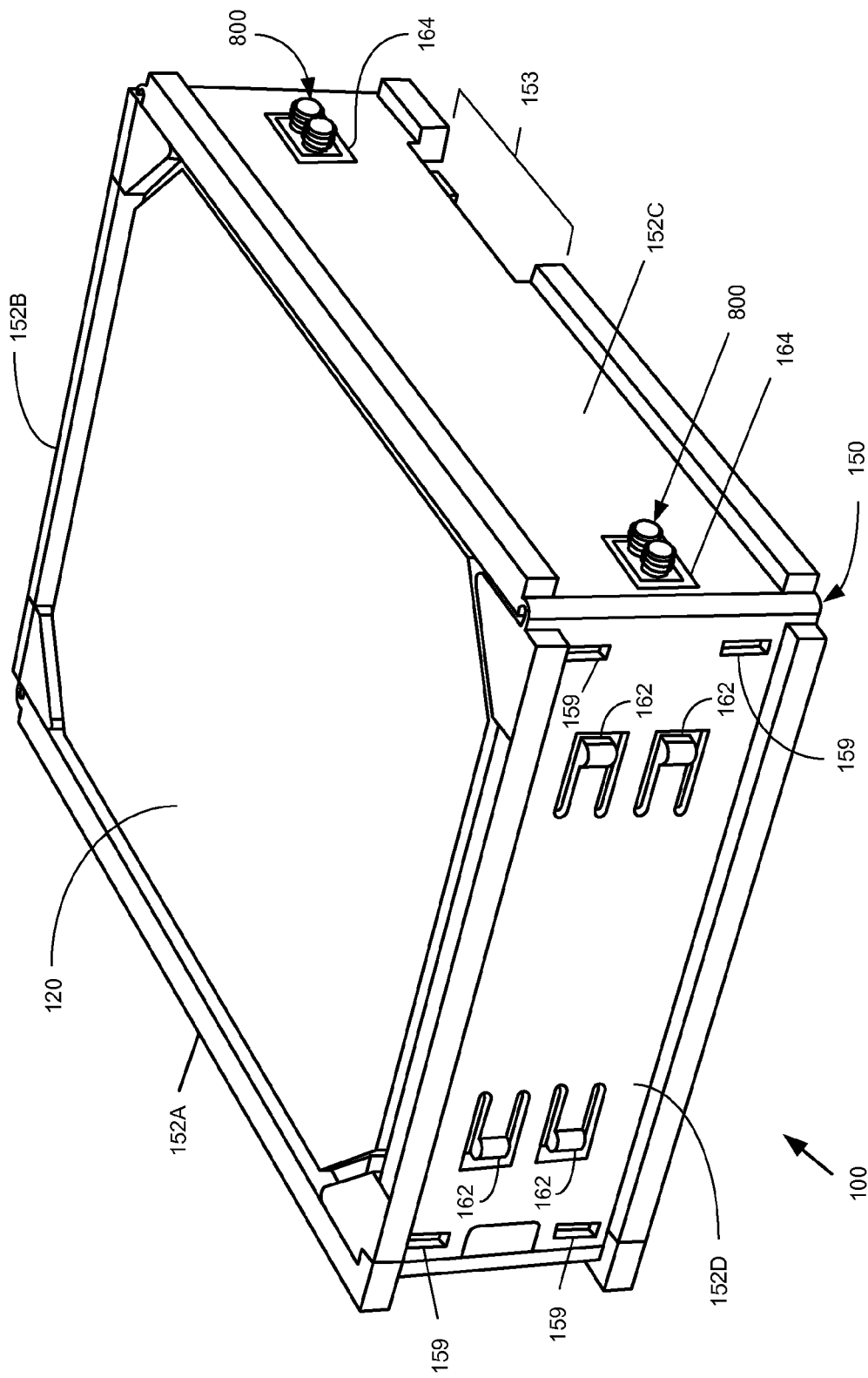
FIG. 10 shows the isolator system installed in a joined segmented frame.

The riser block 808 is configured to fit into and be removably or permanently affixed in a corresponding riser aperture 164 formed in a bottom segment of the joined segmented frame 150 (see FIG. 10). The riser block 808 includes one or more damper receptacles 810 configured to receive the one or more elastomeric dampers 825. A damper receptacle 810 comprises a plurality of risers 812 that create a substantially cylindrical bounded region. A central shaft 815 extends at least partially through substantially a center of the damper receptacle 810.

An elastomeric damper 825 comprises a substantially cylindrical body and a central bore 827 extending partially through the body. The central bores 827 of the one or more elastomeric dampers 825 fit over the one or more central shafts 815 and the one or more elastomeric dampers 825 fit into the one or more damper receptacles 810. An elastomeric damper 825 can friction-fit to a central shaft 815. The one or more elastomeric dampers 825 are formed of an at least partially elastomeric material. The one or more elastomeric dampers 825 in some examples are formed of an elastomeric material or viscoelastomeric material.

The damper receptacle 810 is larger than the elastomeric damper 825. As a result, the one or more coil springs 829 can be inserted over the one or more elastomeric dampers 825 and can be received and contained within the damper receptacle 810. The one or more coil springs 829 are therefore located over the one or more elastomeric dampers 825. The one or more elastomeric dampers 825 in some examples have tapered outer surfaces that retain the one or more coil springs 829.

The one or more elastomeric dampers 825 and the one or more coil springs 829 compress in response to force and provide shock and vibration isolation. An elastomeric damper 825 of the one or more elastomeric dampers bulges radially outward from a central (i.e., long) axis when compressed. As a result, the bulging elastomeric damper 825 contacts and progressively inhibits compression of the corresponding coil spring 829, increasing the spring resistance of the coil springs 829 and preventing oscillation of the isolator system 800. The bulging elastomeric damper 825 adds an increasing frictional force to the continuing compression of the coil spring 829, so that the compression force must progressively increase to continue compressing the combined elastomeric damper 825 and the coil spring 829. The increasing resistance provided by the combination of the elastomeric damper 825 and the coil spring 829 inhibits follow-on oscillations of the coil spring 829.

The riser 812 further includes a flange 831. The flange 831 extends at least partially around the perimeter of the riser block 808. The flange 831 prevents the isolator system 800 from passing through the riser aperture 164 in the joined segmented frame 150. One or more retainer devices 834 are formed as part of the riser block 808 and are configured to removably affix the riser block 808 in a riser aperture 164 of the joined segmented frame 150. The one or more retainer devices 834 are configured to pass through the riser aperture 164 by being temporarily deformed during insertion. The one or more retainer devices 834 are resilient and spring back to engage an opposite surface of the joined segmented frame 150 from the perimeter flange 831. However, the one or more retainer devices 834 are longer than the thickness of the bottom frame segment 152C and therefore include a predetermined clearance space, allowing the riser block 808 to move up and down within the riser aperture 164. The isolator system 800 therefore can move and transmit a spring force to the mounting wings 123 of the storage drive (see FIG. 11 and the accompanying discussion below).

Figure 9:
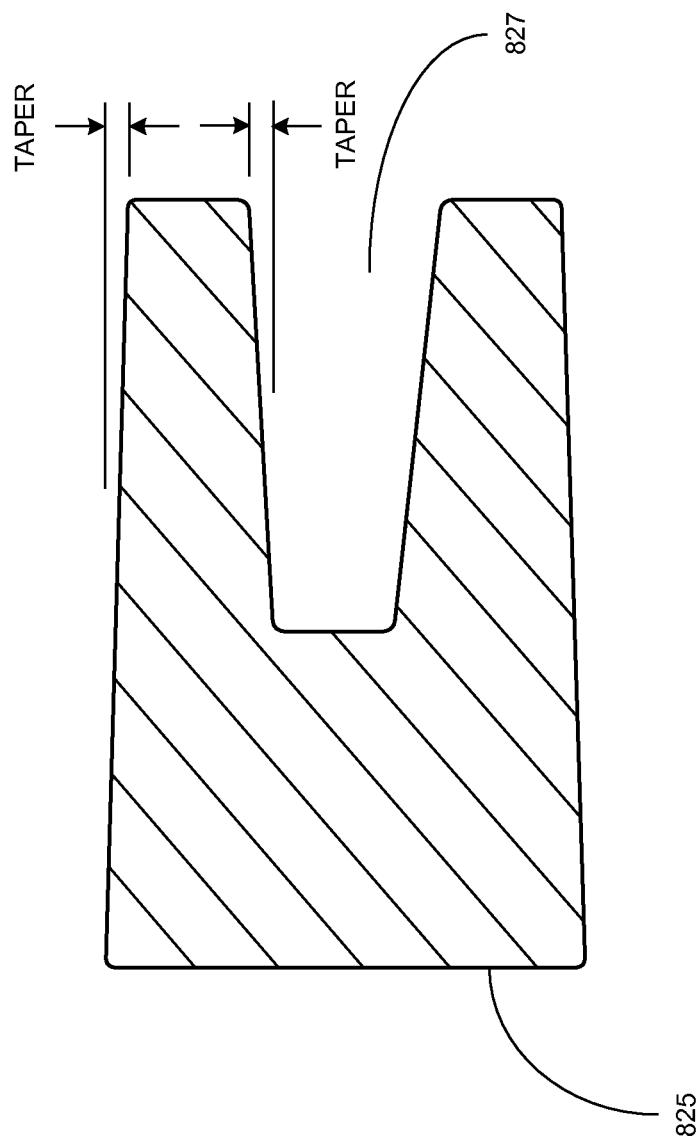
FIG. 9 is a cross-section AA of the elastomeric damper.

FIG. 9 is a cross-section AA of the elastomeric damper 825. The elastomeric damper 825 has a nearly cylindrical shape. However, the elastomeric damper 825 has a small taper, with the right end being smaller than the left end in the figure. The right end includes the central bore 827. The right end is configured to fit into a receptacle 810 of the isolator system 800.

In addition, the central bore 827 is tapered in some examples, being smaller in diameter at the left end of the central bore 827. The taper in the outer surface of the elastomeric damper 825 retains the coil spring 829 on the elastomeric damper 825.

FIG. 10 shows the isolator system 800 installed in a joined segmented frame 150. The joined segmented frame 150 in this example includes a connector cut-out 153. In some examples, a joined segmented frame 150 can include two spaced-apart damper systems 800, as shown in the figure. The two spaced-apart damper systems 800 are installed in a bottom frame segment 152C of the joined segmented frame 150. The joined segmented frame 150 and the storage drive 120 can now be installed into a sled frame 205.

The isolator system 800 is loosely held in the bottom frame segment 152C, but can move up and down in the riser aperture 164 of the bottom frame segment 152C. The isolator system 800 contacts and supports the corresponding isolator cup 180 (and the corresponding mounting wing 123) with respect to the joined segmented frame 150. Therefore, when two isolator systems 800 are inserted into the joined segmented frame 150, the two isolator systems 800 contact the bottom surface of the sled frame 205 and provide support forces on the bottom pair of isolator cups 180. In this manner, the two isolator systems 800 act to maintain the sway space between the joined segmented frame 150 and the sled frame 205. The isolator system 800 therefore counteracts at least some of the weight of the storage drive 120 (and counteracts compression of the isolator cups 180). Further, the isolator system 800 provides shock and vibration isolation between the storage drive 120 and the sled frame 205.

Figure 11:
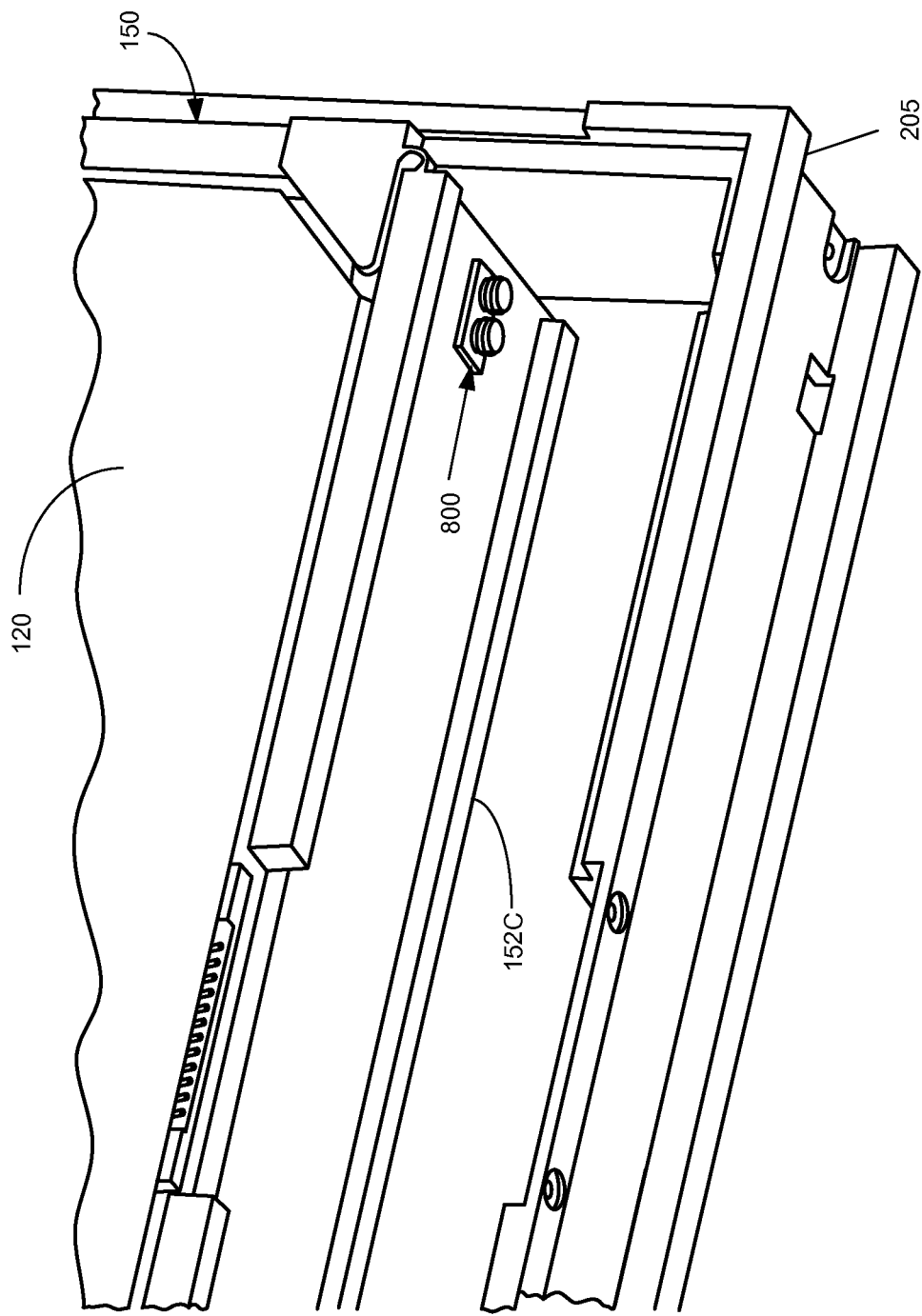
FIG. 11 shows a joined segmented frame partially inserted into a storage drive bay of a sled frame.

FIG. 11 shows a joined segmented frame 150 partially inserted into a storage drive bay 215 (see FIG. 6) of a sled frame 205. As the joined segmented frame 150 is inserted, the isolator system 800 will eventually contact and rest on the bottom of the sled frame 205. The isolator system 800 will therefore be at least partially compressed as a result. In some examples, the isolator system 800 can be configured to retain some compressibility when the joined segmented frame 150 and the storage drive 120 are fully inserted, wherein the isolator system 800 absorbs shocks and vibrations and isolates the storage drive 120 within the sled frame 205.

Figure 12:
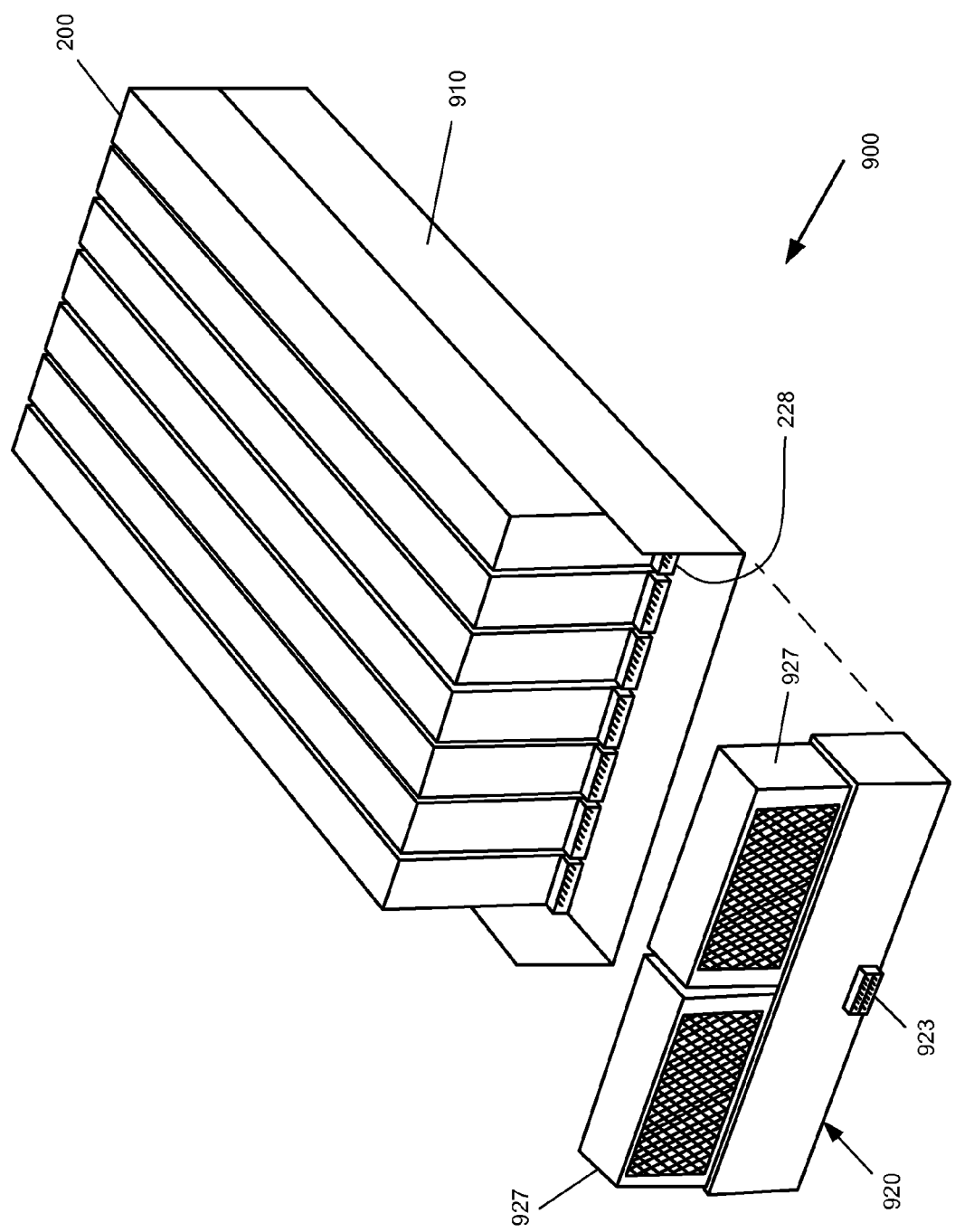
FIG. 12 shows an exemplary chassis assembly.

FIG. 12 shows an exemplary chassis assembly 900. In this example, the chassis assembly 900 includes a chassis tray 910, a chassis I/O module 920, and one or more storage drive sleds 200 installed in the chassis tray 910. In some examples, the storage drive sleds 200 include one or more HDDs.

The chassis assembly 900 comprises a modular storage system. The chassis assembly 900 can be quickly and easily installed to (or removed from) a data storage rack system. The chassis assembly 900 is substantially self-contained, wherein electrical power and data exchange can be accomplished through the chassis I/O module 920.

The interior surface of the chassis tray 910 can include any manner of guide or alignment mechanisms or features for receiving the storage drive sleds 200. The interior surface of the chassis tray 910 can include any manner of attachment or hold-down mechanisms or features for receiving the storage drive sleds 200. It should be understood that the chassis assembly 900 can be used with any number of storage drive sleds 200 installed. Further, the exterior surface of the chassis tray 910 can include mechanisms or features for installing the chassis assembly 900 to a rack, system, or other receptacle or structure.

The chassis I/O module 920 can be permanently or removably affixed to the chassis tray 910 to complete the assembled chassis assembly 900. The chassis I/O module 920 in the example shown includes the chassis I/O connector 923 and one or more power supply modules 927. Data exchange can be accomplished through the chassis I/O connector 923. The one or more power supply modules 927 provide electrical power to the one or more storage drive sleds 200.

The chassis I/O connector 923 is configured to couple to an external bus, network, or system. The chassis I/O connector 923 is coupled to circuitry and to a plurality of individual sled connectors (not shown) on the rear of the chassis I/O module 920, wherein the individual sled connectors couple to each backplane connector 228 of each installed storage drive sled 200. The chassis I/O connector 923 exchanges signals or communications between the plurality of storage drive sleds 200 and one or more external devices or systems. The chassis I/O connector 923 therefore includes suitable communication links, including electrical, optical, or other suitable communication links for transferring digital data.

The one or more power supply modules 927 in one example comprise power supplies for providing electrical power to the installed storage drive sleds 200. More than one power supply can be employed, such as where redundant power supplies are desired. Each power supply module 927 is coupled to an electrical cable (not shown) and includes a fan unit that is used to cool the power supply 927. The fan unit in some examples is run only when needed, i.e., only when the temperature of the power supply module 927 exceeds a temperature threshold.

While the present invention has been particularly shown and described with reference to the preferred implementations, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A segmented frame adapted to receive a storage drive, comprising:
   a plurality of linked frame segments configured to pivot with respect to each other and wrap around the storage drive, with a first frame segment and a last frame segment of the plurality of linked frame segments latching together to form a joined segmented frame and hold the storage drive; and
   a plurality of isolator cups trapped within the joined segmented frame and fitting over a corresponding plurality of mounting wings extending from the storage drive, wherein the plurality of isolator cups suspend the storage drive within the joined frame.

2. The segmented frame of claim 1, with the plurality of linked frame segments including pairs of spaced-apart bulwarks, with a pair of spaced-apart bulwarks trapping an isolator cup in a corner of the joined frame and thereby holding a mounting wing of the storage drive.

3. The segmented frame of claim 1, with the plurality of isolator cups being formed of an elastomeric material or a viscoelastomeric material.

4. The segmented frame of claim 1, with an isolator cup of the plurality of isolator cups including a plurality of compressible ridges on an external surface or surfaces.

5. The segmented frame of claim 1, with the storage drive being substantially rectangular and with the joined frame comprising four linked frame sections joined to form a substantially rectangular frame corresponding to the storage drive, wherein the joined segmented frame holds the storage drive at the four corners of the storage drive and wherein a sway space exists between the joined segmented frame and the storage drive outside of the corners.

6. The segmented frame of claim 1, with the frame configured to be received in a storage drive bay of a sled frame.

7. The segmented frame of claim 1, with the frame configured to be received in a storage drive bay of a sled frame and with side frame sections of the plurality of linked frame sections including one or more resistance elements that contact a side member of a storage drive bay of the sled frame and counteract a weight of the storage drive when the storage drive and the joined segmented frame are inserted into the storage drive bay.

8. The segmented frame of claim 1, with the segmented frame further comprising:
one or more riser apertures formed in a bottom frame segment; and
one or more corresponding isolator systems installed in the one or more riser apertures and extending outward from the bottom frame segment, with an isolator system comprising:
a riser block configured to be affixed in a riser aperture of the segmented frame, with the riser block including one or more damper receptacles and one or more corresponding central shafts extending up at least partially through the one or more damper receptacles;
one or more elastomeric dampers comprising substantially cylindrical bodies and central bores extending partially through the bodies, with the one or more elastomeric dampers fitting over the one or more shafts and into the damper receptacles, with the one or more elastomeric dampers being formed of an at least partially elastomeric material; and
one or more coil springs located over the one or more elastomeric dampers, wherein the one or more elastomeric dampers and the one or more coil springs compress in response to force.

9. A storage drive system, comprising:
a storage drive comprising a body and a plurality of mounting wings protruding from the body;
a plurality of linked frame segments configured to pivot with respect to each other and wrap around the storage drive, with a first frame segment and a last frame segment of the plurality of linked frame segments latching together to form a joined segmented frame and hold the storage drive; and
a plurality of isolator cups trapped within the joined segmented frame and fitting over the corresponding plurality of mounting wings extending from the storage drive, wherein the plurality of isolator cups suspend the storage drive within the joined frame.

10. The storage drive system of claim 9, with the plurality of linked frame segments including pairs of spaced-apart bulwarks, with a pair of spaced-apart bulwarks trapping an isolator cup in a corner of the joined frame and thereby holding a mounting wing of the storage drive.

11. The storage drive system of claim 9, with the plurality of isolator cups being formed of an elastomeric material or a viscoelastomericmaterial.

12. The storage drive system of claim 9, with an isolator cup of the plurality of isolator cups including a plurality of compressible ridges on an external surface or surfaces.

13. The storage drive system of claim 9, with the storage drive being substantially rectangular and with the joined frame comprising four linked frame sections joined to form a substantially rectangular frame corresponding to the storage drive, wherein the joined segmented frame holds the storage drive at the four corners of the storage drive and wherein a sway space exists between the joined segmented frame and the storage drive outside of the corners.

14. The storage drive system of claim 9, with the frame configured to be received in a storage drive bay of a sled frame.

15. The storage drive system of claim 9, with the frame configured to be received in a storage drive bay of a sled frame and with side frame sections of the plurality of linked frame sections including one or more resistance elements that contact a side member of a storage drive bay of the sled frame and counteract a weight of the storage drive when the storage drive and the joined segmented frame are inserted into the storage drive bay.

16. The storage drive system of claim 9, with the segmented frame further comprising:
one or more riser apertures formed in a bottom frame segment; and
one or more corresponding isolator systems installed in the one or more riser apertures and extending outward from the bottom frame segment, with an isolator system comprising:
a riser block configured to be affixed in a riser aperture of the segmented frame, with the riser block including one or more damper receptacles and one or more corresponding central shafts extending up at least partially through the one or more damper receptacles;
one or more elastomeric dampers comprising substantially cylindrical bodies and central bores extending partially through the bodies, with the one or more elastomeric dampers fitting over the one or more shafts and into the damper receptacles, with the one or more elastomeric dampers being formed of an at least partially elastomeric material; and
one or more coil springs located over the one or more elastomeric dampers, wherein the one or more elastomeric dampers and the one or more coil springs compress in response to force.

17. A storage drive sled, comprising:
a sled frame including a plurality of storage drive bays configured to receive a plurality of joined segmented frames;
a frame cap configured to be affixed to the sled frame and close off the plurality of storage drive bays; and
one or more storage drive systems installed into the plurality of drive bays, with a storage drive system of the one or more storage drive systems comprising:
a storage drive comprising a body and a plurality of mounting wings protruding from the body;
a plurality of linked frame segments configured to pivot with respect to each other and wrap around the storage drive, with a first frame segment and a last frame segment of the plurality of linked frame segments latching together to form a joined segmented frame and hold the storage drive; and
a plurality of isolator cups trapped within the joined segmented frame and fitting over the corresponding plurality of mounting wings extending from the storage drive, wherein the plurality of isolator cups suspend the storage drive within the joined frame.

18. The storage drive sled of claim 17, with the storage drive being substantially rectangular and with the joined frame comprising four linked frame sections joined to form a substantially rectangular frame corresponding to the storage drive, wherein the joined segmented frame holds the storage drive at the four corners of the storage drive and wherein a sway space exists between the joined segmented frame and the storage drive outside of the corners.

19. The storage drive sled of claim 17, with side frame sections of the plurality of linked frame sections including one or more resistance elements that contact a side member of a storage drive bay of the sled frame and counteract a weight of the storage drive when the storage drive and the joined segmented frame are inserted into the storage drive bay.

20. The storage drive sled of claim 17, with the segmented frame further comprising:

one or more riser apertures formed in a bottom frame segment; and
one or more corresponding isolator systems installed in the one or more riser apertures and extending outward from the bottom frame segment, with an isolator system comprising:
 a riser block configured to be affixed in a riser aperture of the segmented frame, with the riser block including one or more damper receptacles and one or more corresponding central shafts extending up at least partially through the one or more damper receptacles;
 one or more elastomeric dampers comprising substantially cylindrical bodies and central bores extending partially through the bodies, with the one or more elastomeric dampers fitting over the one or more shafts and into the damper receptacles, with the one or more elastomeric dampers being formed of an at least partially elastomeric material; and
 one or more coil springs located over the one or more elastomeric dampers, wherein the one or more elastomeric dampers and the one or more coil springs compress in response to force.

* * * * *